(12) United States Patent
Leonowich et al.

(10) Patent No.: US 7,609,097 B2
(45) Date of Patent: Oct. 27, 2009

(54) DRIVER CIRCUIT AND A METHOD FOR MATCHING THE OUTPUT IMPEDANCE OF A DRIVER CIRCUIT WITH A LOAD IMPEDANCE

(75) Inventors: Robert H. Leonowich, Fleetwood, PA (US); Xiaohong Quan, Macungie, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/884,932

(22) Filed: Jul. 6, 2004

(65) Prior Publication Data

US 2006/0006912 A1  Jan. 12, 2006

(51) Int. Cl.
*H03K 3/00* (2006.01)
(52) U.S. Cl. .......................................... 327/108; 326/81
(58) Field of Classification Search ................. 327/108, 327/109, 112, 423; 326/30, 81
See application file for complete search history.

(56) References Cited

U.S. PATENT DOCUMENTS

| | | | | |
|---|---|---|---|---|
| 4,918,336 A * | 4/1990 | Graham et al. | ............... | 326/117 |
| 5,561,382 A * | 10/1996 | Ueda et al. | ..................... | 326/66 |
| 5,977,796 A * | 11/1999 | Gabara | ........................ | 326/86 |
| 6,194,920 B1 * | 2/2001 | Oguri | .......................... | 327/65 |
| 6,215,302 B1 * | 4/2001 | Carey | .......................... | 324/252 |
| 6,222,388 B1 * | 4/2001 | Bridgewater, Jr. | ............ | 326/86 |
| 6,236,247 B1 * | 5/2001 | Ngo | ............................. | 327/110 |
| 6,275,078 B1 * | 8/2001 | Zabroda | ....................... | 327/108 |
| 6,281,715 B1 * | 8/2001 | DeClue et al. | ................. | 327/65 |
| 6,356,141 B1 * | 3/2002 | Yamauchi | .................... | 327/543 |
| 6,404,269 B1 * | 6/2002 | Voldman | ..................... | 327/534 |
| 6,433,579 B1 * | 8/2002 | Wang et al. | ..................... | 326/38 |
| 6,448,815 B1 * | 9/2002 | Talbot et al. | .................. | 326/86 |
| 6,590,422 B1 * | 7/2003 | Dillon | ......................... | 326/86 |
| 6,809,591 B1 * | 10/2004 | Ohashi | ....................... | 330/279 |
| 6,812,732 B1 * | 11/2004 | Bui | ............................. | 326/30 |
| 6,812,733 B1 * | 11/2004 | Plasterer et al. | ............... | 326/30 |
| 6,812,735 B1 * | 11/2004 | Pham | ......................... | 326/30 |
| 6,943,588 B1 * | 9/2005 | Luo et al. | ..................... | 326/86 |
| 7,012,450 B1 * | 3/2006 | Oner et al. | ..................... | 326/86 |
| 2003/0085737 A1 * | 5/2003 | Tinsley et al. | ................. | 326/86 |
| 2003/0094977 A1 * | 5/2003 | Li et al. | ......................... | 327/65 |
| 2003/0137352 A1 * | 7/2003 | Youn et al. | .................. | 330/277 |

* cited by examiner

*Primary Examiner*—Lincoln Donovan
*Assistant Examiner*—Thomas J Hiltunen
(74) *Attorney, Agent, or Firm*—Daniel J. Santos; John M. Harman

(57) ABSTRACT

A line driver circuit with an output impedance that is set to a value which is based at least in part on the impedance of one or more current sources of the driver circuit. The current source impedance varies depending on the desired output amplitude of the driver circuit. Once the current source impedance is determined, a resistor is selected to be placed in parallel connection with the current source so that the combination of the resistor and the current source impedance will produce a desired output impedance for the driver circuit. Preferably, the driver circuit includes a second current source and second resistor in parallel with each other and a source termination resistor, such that the combination of the current source impedance values and the resistor values produces a desired output impedance for the driver circuit.

4 Claims, 5 Drawing Sheets

DRIVER CIRCUIT AND A METHOD FOR MATCHING THE OUTPUT IMPEDANCE OF A DRIVER CIRCUIT WITH A LOAD IMPEDANCE

TECHNICAL FIELD OF THE INVENTION

The invention relates to a driver circuit of an integrated circuit (IC) and a method for matching the output impedance of the driver circuit with a load impedance. More particularly, the invention relates to a driver circuit with an output impedance that is set to a value that is based at least in part on the impedance of one or more current sources of the driver circuit.

BACKGROUND OF THE INVENTION

A line driver circuit is a circuit that is used to place a differential voltage across two conductors, such as, for example, the conductors that make up a telephone line, the traces of a printed circuit (PC) board, or any other type of electrically conductive transmission medium. A typical line driver circuit steers current through an N field effect transistor (NFET)/P field effect transistor (PFET) device that acts as a current source to set the current in the transmission medium load and to set the output amplitude of the driver circuit.

FIG. 1A is a block diagram of a known line driver circuit 1 connected by a transmission medium to a receiver circuit 11. The driver circuit 1 includes first and second current sources 2 and 3 that mirror each other and that cause an output voltage differential to be produced across output terminals 4 and 5 of the driver circuit 1. The current sources typically are Field Effect Transistors (FETs) fabricated in a Complementary Metal Oxide Semiconductor (CMOS) process. An explicit transmitter_terminating resistor $R_{EX}$ is connected between the output terminals 4 and 5 of the driver circuit 1. The receiver circuit 11 is connected to the output terminals 4 and 5 of the driver circuit by a transmission line comprising conductors 14 and 15, respectively. In a typical system, the impedance of the transmission line ($R_{TL}$) is ideally matched by the receiver's termination resistor $R_{LOAD}$.

The driver circuit 1 has switches 6-9 the are switched in a particular manner to control the polarity of the signal output from the driver circuit 1 at output terminals 4 and 5. The driver circuit operates as follows. When switches 6 and 8 are closed, the driver current follows the paths represented by arrows 12A and 12B. The portion of the current represented by arrow 12A passes through the explicit terminating resistor $R_{EX}$ and continues along the path shown. The portion of the current represented by arrow 12B continues along the transmission line 14 to the receiver circuit 11 and through the receiver's explicit termination resistor $R_{LOAD}$. The current passing through the explicit terminating resistor $R_{EX}$ produces a voltage differential across $R_{EX}$ that decreases across $R_{EX}$ in the direction from terminal 4 to terminal 5.

FIG. 1B is a block diagram of the same driver circuit 1 shown in FIG. 1A. However, in FIG. 1B, the driver circuit 1 is configured with switches 7 and 9 closed and switches 6 and 8 opened. When switches 7 and 9 are closed, the current follows the paths represented by arrows 13A and 13B. The portion of the current represented by arrow 13A passes through the explicit terminating resistor $R_{EX}$ while the portion of the current represented by arrow 13B continues along the transmission line 15 to the receiver circuit 11 and through the receiver's explicit termination resistor $R_{LOAD}$. The current represented by arrow 13A that passes through the explicit terminating resistor $R_{EX}$ produces a voltage differential across $R_{EX}$ that decreases across $R_{EX}$ in the direction from terminal 5 to terminal 4.

Thus, when switches 6 and 8 are closed and switches 7 and 9 are opened, the signal that drives the receiver circuit 11 is positive in polarity. Conversely, when switches 7 and 9 are closed and switches 6 and 8 are opened, the signal that drives the receiver circuit 11 is negative in polarity. By operating the driver circuit 1 in this manner, changes in the polarity of the driver circuit output signal can be used to represent binary 1s and 0s. One known signaling format of this type is called nonreturn-to-zero (NRZ).

In order to limit voltage or current reflections, the output impedance of the driver circuit 1 should be matched to the impedance of the load and transmission line. For ease of explanation, it will be assumed that the impedance of the load $R_{LOAD}$ is equal to the characteristic impedance of the transmission line. Therefore, it will also be assumed that the goal of impedance matching is to match the output impedance of the driver circuit 1 with the impedance of the load, which in this case is the explicit termination resistor of the receiver 11 $R_{LOAD}$.

One approach to matching the output impedance of the driver circuit 1 to the impedance of the load is to set the value of the explicit resistor $R_{EX}$ equal to $R_{LOAD}$. However, setting $R_{EX}$ equal to $R_{LOAD}$ would require that the current sources generate a relatively large current, which, in turn, would require that the FETs that constitute the current sources be very large in size. Increasing the size of the FETs would, in turn, result in heavily loading the output of the driver circuit 1 with parasitic capacitance, which is undesirable.

In order to keep the sizes of the current source FETs to a minimum, it is known to set the value of the terminating resistor $R_{EX}$ equal to twice the size of the load impedance (i.e., $R_{EX}=2(R_{LOAD})$). While setting the value of $R_{EX}$ equal to $2R_{LOAD}$ does not provide perfect impedance matching, it limits the buildup of high noise levels caused by multiple reflections between the driver circuit 1 and the receiver circuit 11. Setting $R_{EX}$ equal to $2R_{LOAD}$ also limits the current passing through the terminating resistor $R_{EX}$, which is essentially "wasted" because it is not provided to the load.

In addition, the output impedance of the driver circuit 1 depends in part on the impedances of the current sources 2 and 3, which result from practical non-idealities of the current sources. The impedances of the current sources 2 and 3 change with changes in the operating conditions of the current sources. For example, as a current source goes into the triode region of operation, the impedance of the current source decreases. Setting the value of the terminating resistor $R_{EX}$ equal to $2R_{LOAD}$ does not take into account changes in the output impedance of the driver circuit that result from changes in the impedances of the current sources.

A need exists for a driver circuit that has an output impedance that is precisely matched to the load impedance and that is efficient in terms of power consumption. In addition, because the output impedance of the driver circuit changes as a result of the changing impedance of the current sources, a need exists for a driver circuit that has an output impedance that is set to compensate for changes in the impedance of the current sources of the driver circuit.

SUMMARY OF THE INVENTION

The invention provides a line driver circuit of an integrated circuit (IC) comprising a first current source having a first impedance value and a first resistor connected in parallel with the first current source. The first resistor has a first resistor value that is selected based at least in part on the first impedance value to provide the line driver circuit with a desired output impedance.

The invention also provides a method for providing a line driver circuit of an IC with a desired output impedance. The method comprises selecting a value of a first resistor and placing the first resistor in parallel with a first current source of the driver circuit. The first current source has a first impedance value, and the first resistor is selected such that a combination of the first resistor value and the first impedance value provides the driver circuit with a desired output impedance.

DETAILED DESCRIPTION OF THE PREFERRED EMBODIMENT

In accordance with the present invention, a driver circuit is provided that has an output impedance that is precisely matched to the load impedance. Preferably, a resistor is placed in parallel with each of the current sources and the combination of these resisters in parallel with the impedances of the current sources produces an output impedance of the driver circuit that is precisely matched to the load impedance. The values of the resistors that are placed in parallel with the current sources are chosen taking into account changes in the impedances of the current sources during operation of the driver circuit.

In accordance with the preferred embodiment, a source termination resistor that has a very large value (e.g., approaching infinity) is placed in parallel with the load. Because the value of the terminating resistor is so large, very little, if any, current will pass through the source termination resistor and be "wasted". Thus, very little, if any, power is dissipated in the source termination resistor, while the output impedance of the driver circuit is precisely matched to the impedance of the load.

Figure 1A:
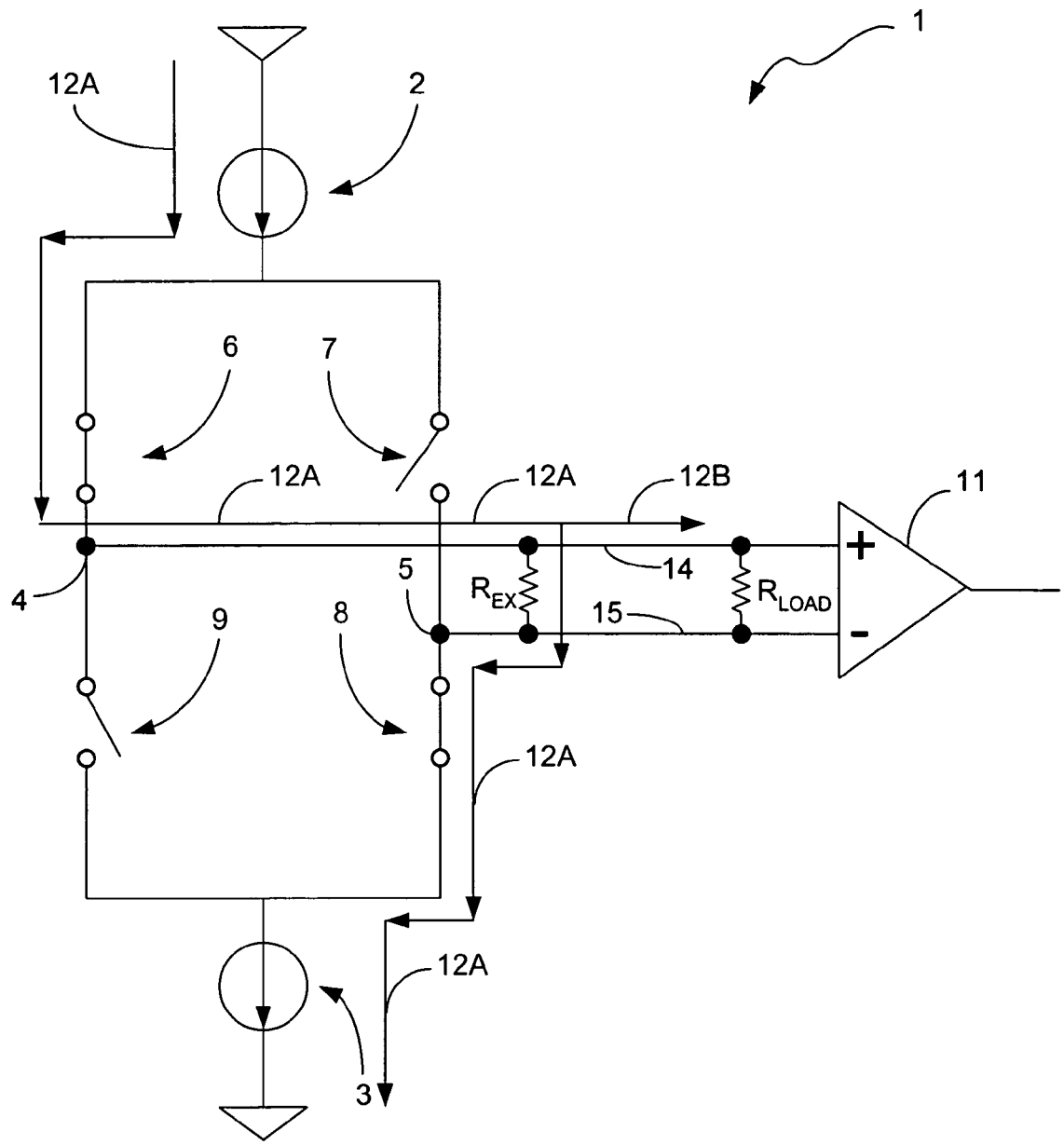
FIG. 1A is a block diagram of a known driver circuit in a first switched configuration.
Figure 1B:
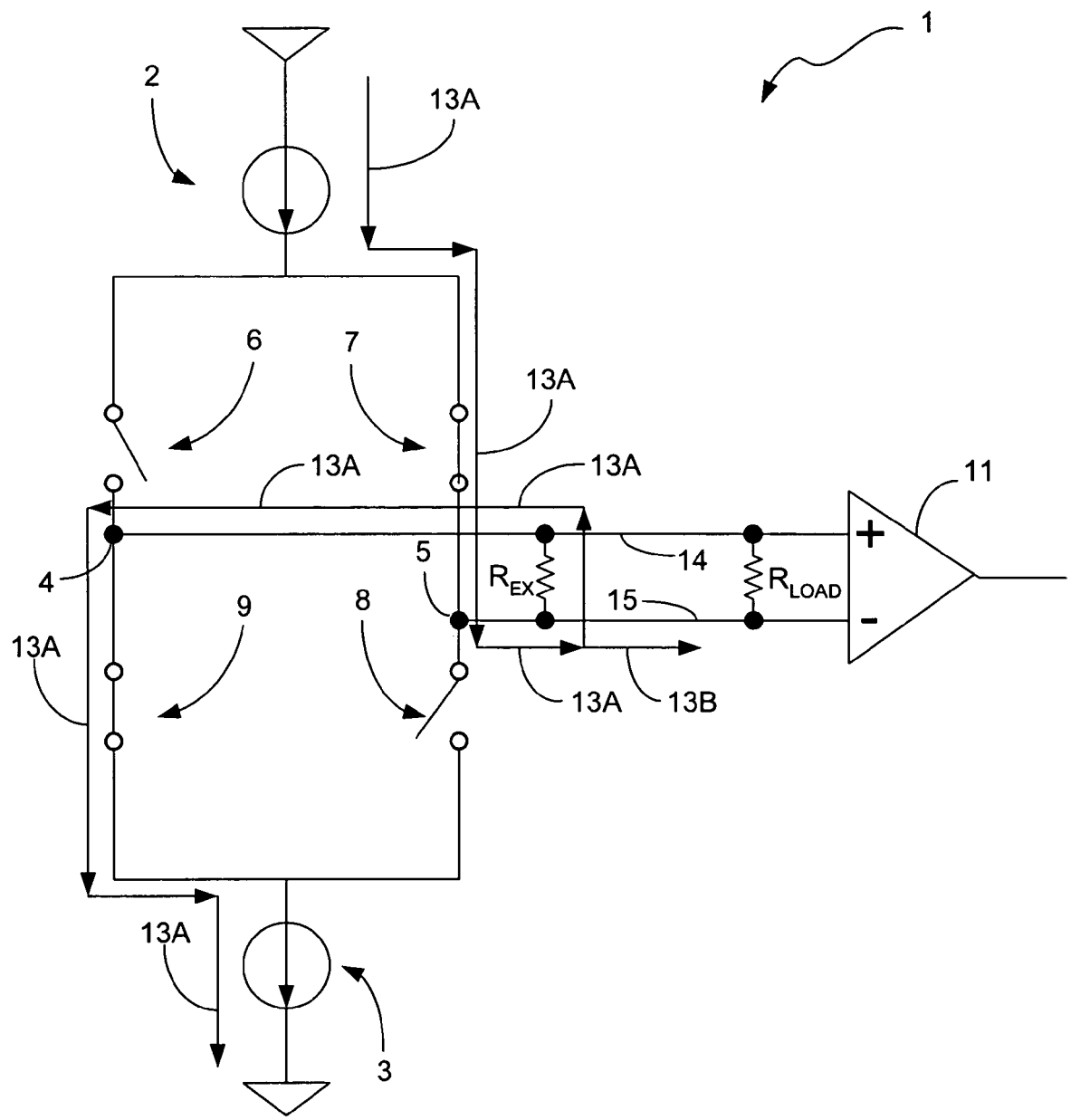
FIG. 1B shows the block diagram shown in FIG. 1A with the driver circuit in a second switched configuration.
Figure 2:
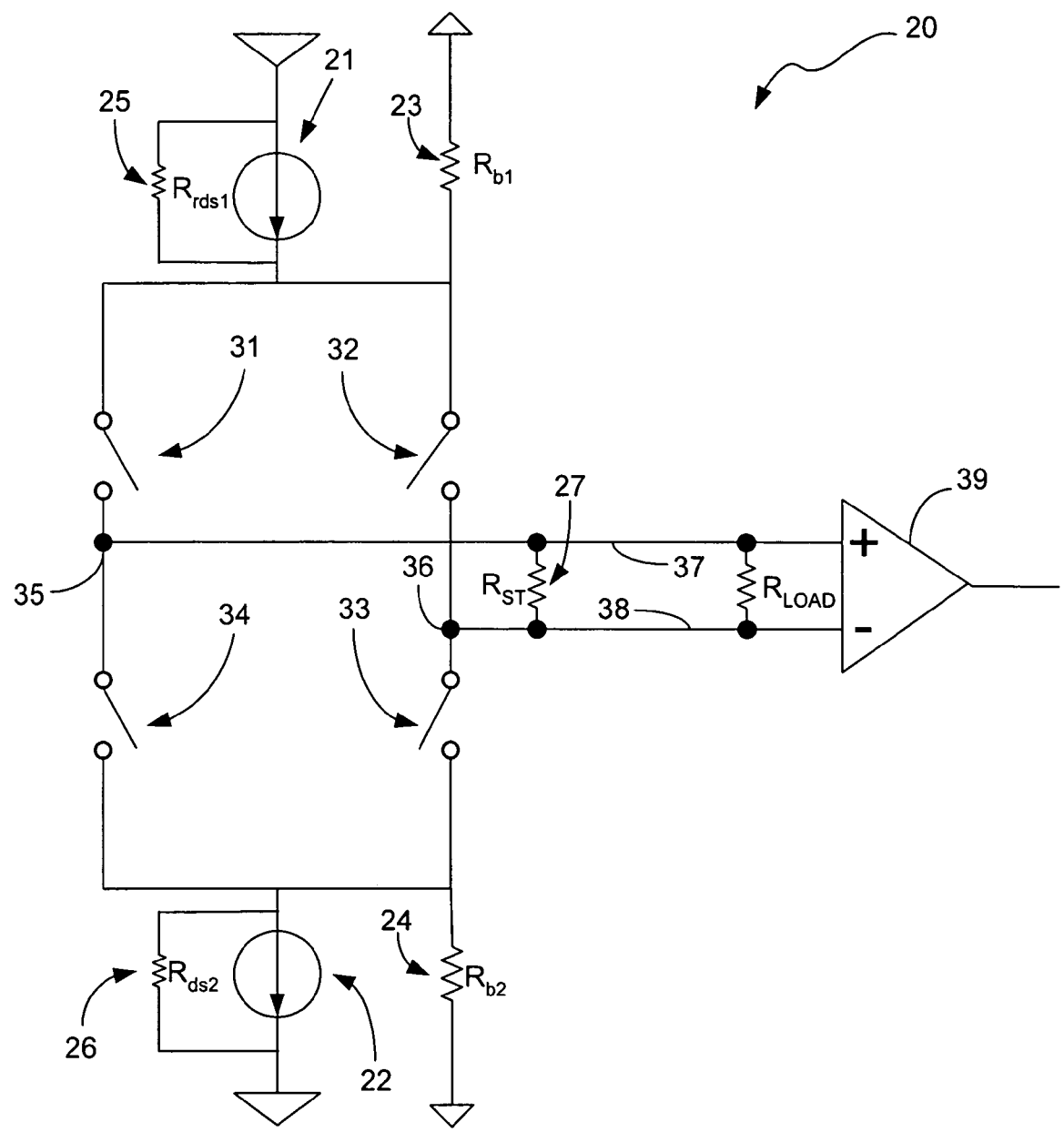
FIG. 2 shows a block diagram of the driver circuit of the present invention in accordance with an embodiment.

FIG. 2 is a block diagram of the driver circuit 20 of the present invention in accordance with an exemplary embodiment. The driver circuit 20 operates in the same manner as the driver circuit 1 described above with reference to FIGS. 1A and 1B. Therefore, the operations of the driver circuit 20 will not be described herein. As with the driver circuit 1 shown in FIGS. 1A and 1B, the driver circuit 20 has a plurality of switches 31-33 and first and second output terminals 35 and 36. The driver circuit 20 is electrically coupled at output terminals 35 and 36 to conductors 37 and 38, respectively, of a transmission line, which is connected to a receiver circuit 39 and to a receiver terminating resistor, $R_{LOAD}$. The driver circuit 20 is terminated with a source termination resistor $R_{ST}$ 27.

The current sources 21 and 22 are in parallel with respective resistors $R_{b1}$ 23 and $R_{b2}$ 24. The current sources 21 and 22 have impedances that are represented by respective resistors $R_{ds1}$ 25 and $R_{ds2}$ 26. As stated above, the current source impedances result from non-idealities of the current sources. Therefore, the resistors 25 and 26 shown in FIG. 2 are not explicit resistors, but rather, represent the drain-to-source resistances of the respective FETs that function as the respective current sources.

In accordance with the present invention, it has been determined that precise output impedance can be achieved with low power loss by placing the resistors $R_{b1}$ and $R_{b2}$ in parallel with the current sources 21 and 22 and by selecting their values and the value of the source termination resistor $R_{ST}$ 27 taking into account the desired output amplitude of the driver circuit 20, which, in turn, depends on the magnitude of the current signals produced by the current sources.

When the driver circuit 20 is intended to generate signals that have large amplitudes, the current sources 21 and 22 will typically be operating in the triode region. When the current sources 21 and 22 are operating in the triode region, their impedances, which are represented by the source-to-drain resistors $R_{ds1}$ 25 and $R_{ds2}$ 26, typically decrease drastically due to the current sources becoming less ideal. To provide load impedance matching, the values of the resistors $R_{b1}$ 23 and $R_{b2}$ 24 are selected so that the parallel combination of the resistors $R_{b1}$ 23 and $R_{ds1}$ 25 plus the parallel combination of resistor $R_{b2}$ 24 and $R_{ds2}$ 26 all in combination with the source termination resistor $R_{ST}$ 27 matches the load impedance represented by $R_{LOAD}$. This relationship can be expressed mathematically as follows:

$$[[R_{b1}\|R_{ds1}]+[R_{b2}\|R_{ds2}]]\|R_{ST}=R_{LOAD} \quad \text{(Equation 1)}$$

For ease of explanation, it will be assumed that the impedance of the load $R_{LOAD}$ is equal to the characteristic impedance of the transmission line. Therefore, impedance matching can be accomplished by matching the output impedance of the driver circuit 1 with the impedance of the load, which in this case is assumed to be the explicit termination resistor of the receiver 39, $R_{LOAD}$. Of course, the invention is not limited with respect to the values of the characteristic impedance of the transmission line or the receiver termination resistor, or with respect to whether or not those values are equal.

Typically, as the output amplitude of the driver circuit 20 increases, the current sources 21 and 22 need to supply more current. In cases where it is desirable to supply more current, the current sources are operating in saturation. When a current source is in saturation, its output conductance, $G_O$, is proportional to the current. As a result, the output impedance of the current source is roughly inversely proportional to the output amplitude. In order to compensate for the variation of current source impedance, the values of the resistors $R_{b1}$ and $R_{b2}$ are selected so that their values are larger when the current flowing through the current sources increases.

When the current sources are operating in the triode region, the output amplitude of the driver circuit 20 is very large. In these situations, the output impedances $R_{ds1}$ 25 and $R_{ds2}$ 26 of the current sources 21 and 22, respectively, are no longer inversely proportional to the magnitude of the current. Rather, the output impedances $R_{ds1}$ 25 and $R_{ds2}$ 26 decrease even more dramatically with the increasing output amplitude. In accordance with the present invention, it has been determined that by allowing the terms $R_{b1}\|R_{ds1}$ and/or $R_{b2}\|R_{ds2}$ to be very small (e.g., at or approaching 50 ohms ($\Omega$)), then the resistors $R_{b1}$ and $R_{b2}$ can be chosen to be so large that the impedances $R_{ds1}$ and $R_{ds2}$ begin to dominate Eq. 1, so much so that all of the explicit resistors $R_{b1}$, $R_{b2}$ and $R_{ST}$ can be eliminated.

When the output amplitude of the driver circuit 20 is intended to have a wide range, the range may be partitioned into multiple sub-ranges. Then, if the driver circuit 20 is intended to operate at one of the relatively large amplitude sub-ranges, a relatively large value of $R_{LOAD}$ is chosen and a relatively small value of the term $R_{b1} \| R_{ds1}$ is chosen. Not only does this save power (by using a very large $R_{LOAD}$ value), but since the value of the term $R_{b1} \| R_{ds1}$ is small, further degradation of $R_{ds1}$ will have less overall impact on impedance matching. Generally, but not necessarily, $R_{b1}=R_{b2}$ and $R_{d1}=R_{d2}$. Likewise, generally, but not necessarily, the term $R_{b1} \| R_{ds1}$ is equal to the term $R_{b2} \| R_{ds2}$.

Thus, the values of the resistors $R_{b1}$ 23 and $R_{b2}$ 24 can be tuned to provide the driver circuit 20 with perfect impedance matching at the desired output signal amplitude. In addition, the value of resistor $R_{ST}$ 27 typically is selected to be large in order to reduce the amount of "wasted" current that passes through that resistor, which helps optimize power loss in the driver circuit 20.

Figure 3:
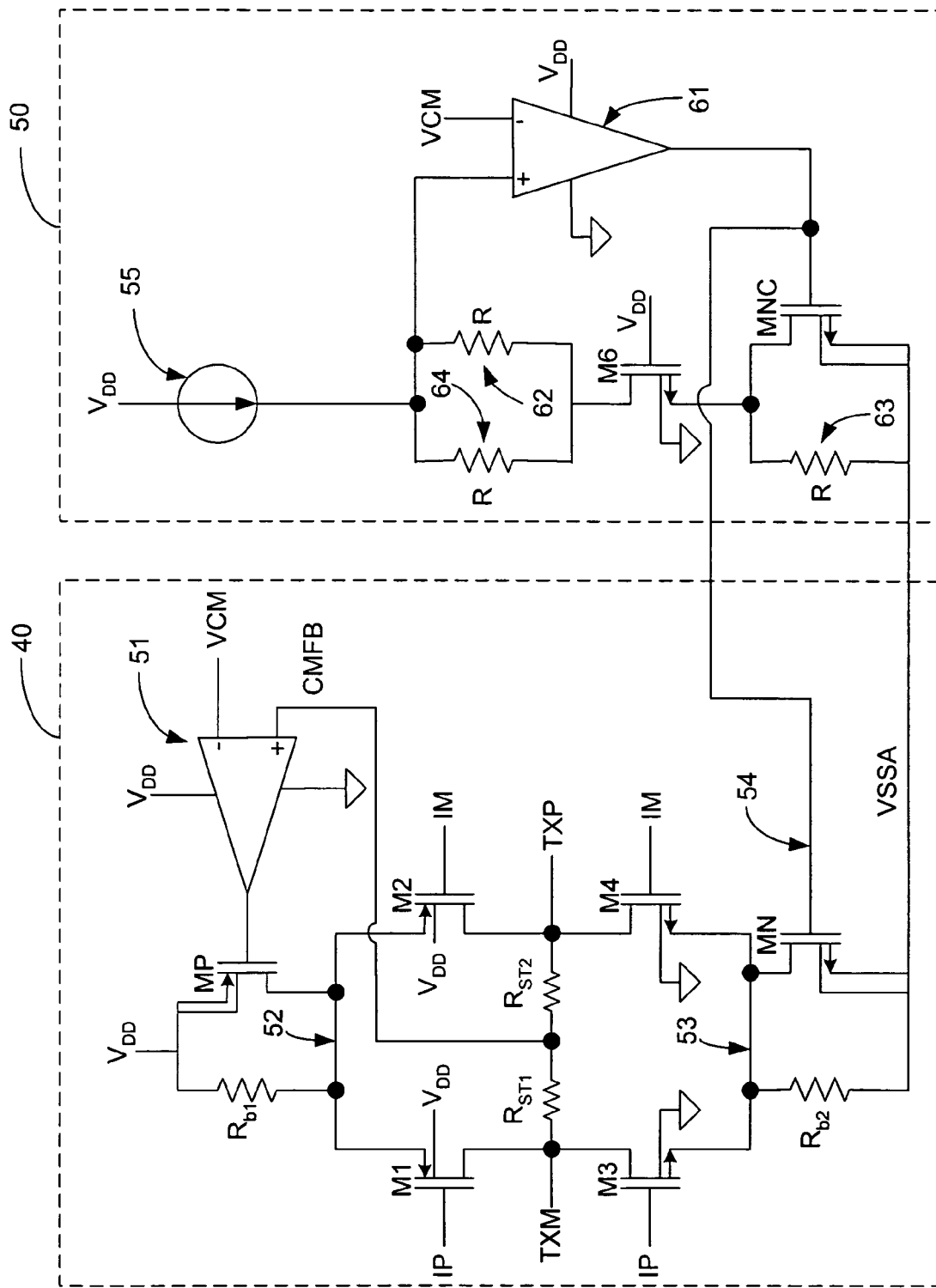
FIG. 3 shows a schematic circuit diagram of the driver circuit of the present invention in accordance with an embodiment.

FIG. 3 is a schematic diagram of the driver circuit 40 of the present invention in accordance with an exemplary embodiment. In FIG. 3, the FETs labeled M1, M2, M3 and M4 are the switches that perform the switching functions described above with reference to items 31-34 in FIG. 2. The FETs labeled MP and MN are the current sources that perform the functions described above with reference to items 21 and 22, respectively, in FIG. 2. The two resistors labeled $R_{ST1}$ and $R_{ST2}$ in FIG. 3 are source termination resistors, which together accomplish the same objective as the source termination resistor $R_{ST}$ 27 in FIG. 2. The resistors labeled $R_{b1}$ and $R_{b2}$ in FIG. 3 correspond to the resistors $R_{b1}$ 23 and $R_{b2}$ 24, respectively, in FIG. 2, which are the resistors that are added in parallel with the current sources MP and MN to adjust the output impedance of the driver circuit 40.

The operational amplifier (op amp) 51 provides common-mode feedback control for the core of driver circuit 40. The input to the op amp 51 labeled VCM is the reference voltage that defines the common-mode voltage. The input to the op amp 51 labeled CMFB corresponds to a node that senses the common-mode voltage between the output terminals TXP and TXM of the driver circuit 40. These output terminals perform the same output functions for the driver circuit 40 as the functions performed by the output terminals 35 and 36 in FIG. 2.

The feedback provided to op amp 51 from node CMFB adjusts the voltage at the output of the current source MP so that the inputs CMFB and VCM to op amp 51 are kept equal to one another. This feedback loop ensures that the current at the node 52 is equal to the current at the node 53.

The circuit 50 to the right of the driver circuit 40 is a tuning circuit used to ensure that the output amplitude of the driver circuit 40 at the output terminals TXM and TXP is as expected. Placing the resistor $R_{b2}$ in parallel with current source FET MN causes variations to occur in the partitioning of the current to resistor $R_{b2}$ and FET MN. These variations are capable of causing the output amplitude of the driver circuit 40 to vary. In order to ensure that the current at node 53 is what it is intended to be, the tuning circuit 50 uses a scaled down version of the feedback loop of the driver circuit 40 to cause the proper voltage to be generated at node 54, which, in turn, ensures that the output amplitude of the driver circuit 40 is what it is intended to be.

The current source 55 is used to set the output amplitude of the driver circuit 40. The output amplitude of the driver circuit 40 at output terminals TXP and TXM can be varied by varying the current produced by the current source 55. The tuning circuit 50 includes an op amp 61 that provides a negative feedback loop to generate the voltage at node 54, which drives the gate of current source FET MN. A resistor 62 of the tuning circuit 50 is a scaled version (e.g., 20×) of source terminating resistor $R_{ST2}$, which is typically a 50 Ω resistor. The FET M6 is a scaled version of one of the FET switches, which are typically of the same size. The FET MNC is a scaled version of the current source of the driver circuit 40 labeled MN (e.g., the width-to-length (W/L) ratio of MNC is 1/20 the W/L ratio of MN). The resistor 63 similarly is a scaled version of the resistor $R_{b2}$. The resistor 64 typically is 1 kΩ ($20 \times R_{TL}$).

The circuit shown in FIG. 3 essentially operates in the same manner as the circuit shown in FIG. 2, except that the circuit shown in FIG. 3 additionally includes common mode voltage control and amplitude tuning circuitry. It should be noted that the configuration shown in FIG. 3 is only one of many possible configurations for accomplishing the goals of the present invention. Those skilled in the art will understand, in view of the description provided herein, the manner in which other circuits can be designed to achieve the goals of the present invention.

Figure 4:
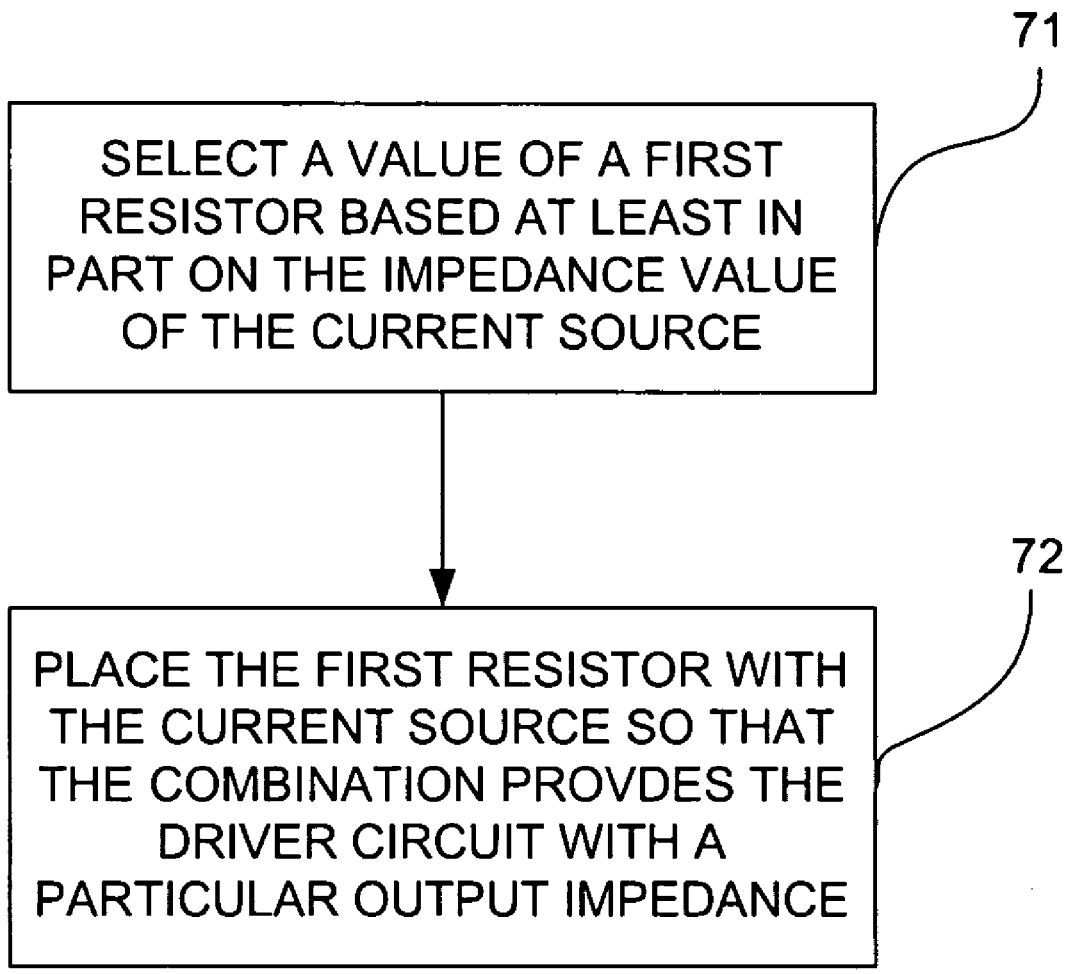
FIG. 4 illustrates a flow chart of the method of the invention in accordance with an embodiment.

FIG. 4 illustrates a flow chart of the method of the invention in accordance with the preferred embodiment. Assuming that the driver circuit has only one current source, the resistor to be placed in parallel with the current source is selected based at least in part on the value of the current source impedance, as indicated by block 71. As stated above, the current source impedances vary depending on the output amplitude of the driver circuit. Because the output amplitude is known, the current source impedance values are also known. Therefore, the value of the resistor to be placed in parallel with the current source can be determined using Eq. 1. The selected resistor is placed in parallel with the current source, as indicated by block 72.

If the driver circuit has more than one current source, preferably a second resistor is selected and placed in parallel with the second current source. The value of the second resistor is selected in the same manner in which the value of the first resistor is selected.

It should be noted that the present invention has been described with reference to particular exemplary embodiments in order to demonstrate some of the principles and advantages of the present invention. The present invention is not limited to these embodiments. Variations and modifications can be made to the embodiments described herein without deviating from the principles and concepts of the invention, and all such modifications and variations are within the scope of the present invention.

What is claimed is:

1. A line driver circuit of an integrated circuit (IC), comprising:

a first current source configured to operate in a triode region such that it has a first impedance value when the first current source is active;

a first resistor connected in parallel with the first current source, the first resistor having a first resistance value;

a second current source configured to operate in a triode region such that it has a second impedance value when the second current source is active;

current switching circuitry coupled to at least one of the first and second current sources;

a second resistor connected in parallel with the second current source, the second resistor having a second resistance value; and a source termination resistor connected across output terminals of the driver circuit, wherein the first and second resistance values and the source termination resistance value are set such that a combination of the first and second impedances, the first and second resistors and the source termination resistor provides the driver circuit with a desired output impedance, wherein the source termination resistance value ($R_{ST}$) is sufficiently large that its effect is mathematically negligible in the expression $((R_{b1}\|R_{ds1})+(R_{b2}\|R_{ds2}))\|R_{ST}$, wherein $R_{b1}$ is the first resistance value, $R_{b2}$ the second resistance value, $R_{ds1}$ is a resistance of the first current source, and $R_{ds2}$ is a resistance of the second current source.

2. The line driver circuit of claim 1, wherein the current sources are transistors.

3. A method for providing a line driver circuit of an integrated circuit (IC) with a desired output impedance, the line driver circuit including current switching circuitry coupled to at least one current source, the method comprising:

selecting a value of a first resistor;

placing the first resistor in parallel with a first current source of the driver circuit, the first current source configured to operate in a triode region such that it has a first impedance value when the first current source is active;

selecting a value of a second resistor;

placing the second resistor in parallel with a second current source of the driver circuit, the second current source configured to operate in a triode region such that it has a second impedance value when the second current source is active;

selecting a value for a source termination resistor; and placing a source termination resistor across output terminals of the driver circuit, and wherein the combination of the first and second impedance values, the first and second resistance value and the source termination resistance value produces a desired output impedance for the driver circuit, wherein the value of the source termination resistor ($R_{ST}$) is sufficiently large that its effect is mathematically negligible in the expression $((R_{b1}\|R_{ds1})+(R_{b2}\|R_{ds2}))\|R_{ST}$, wherein $R_{b1}$ is the first resistance value, $R_{b2}$ the second resistance value, $R_{ds1}$ is a resistance of the first current source, and $R_{ds2}$ is a resistance of the second current source.

4. The method of claim 3, wherein the current sources are transistors.

* * * * *